(12) United States Patent
Lee et al.

(10) Patent No.: US 7,807,336 B2
(45) Date of Patent: *Oct. 5, 2010

(54) METHOD FOR MANUFACTURING SEMICONDUCTOR DEVICE

(75) Inventors: Sung Koo Lee, Seoul (KR); Jae Chang Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 205 days.

This patent is subject to a terminal disclaimer.

(21) Appl. No.: 11/468,080

(22) Filed: Aug. 29, 2006

(65) Prior Publication Data

US 2007/0148602 A1 Jun. 28, 2007

(30) Foreign Application Priority Data

Dec. 28, 2005 (KR) .................. 10-2005-0132109
Jul. 25, 2006 (KR) .................. 10-2006-0069759

(51) Int. Cl.
*G03F 7/00* (2006.01)

(52) U.S. Cl. .................. 430/314; 430/313; 430/311; 430/950

(58) Field of Classification Search .................. None
See application file for complete search history.

(56) References Cited

U.S. PATENT DOCUMENTS

| | | | | |
|---|---|---|---|---|
| 6,475,922 | B1 | 11/2002 | Zheng | 438/725 |
| 6,534,414 | B1 | 3/2003 | Wang et al. | 438/709 |
| 6,589,339 | B2 | 7/2003 | Takeshita et al. | |
| 6,916,749 | B2 | 7/2005 | Tsujita et al. | 438/758 |
| 6,969,580 | B2 * | 11/2005 | Minami | 430/313 |
| 2006/0003268 | A1 * | 1/2006 | Hong et al. | 430/323 |
| 2007/0148983 | A1 * | 6/2007 | Lee et al. | 438/717 |

FOREIGN PATENT DOCUMENTS

| | | | |
|---|---|---|---|
| KR | 10-1998-028362 | * | 7/1998 |
| KR | 10-20010002129 A | | 1/2001 |
| KR | 10-20010108724 A | | 12/2001 |
| KR | 10-20030070658 A | | 9/2003 |

* cited by examiner

*Primary Examiner*—Daborah Chacko Davis
(74) *Attorney, Agent, or Firm*—Marshall, Gerstein & Borun LLP

(57) ABSTRACT

Disclosed herein is a method for manufacturing a semiconductor device that includes performing an $O_2$ plasma treatment step after forming a Si-containing anti-reflection film.

17 Claims, 8 Drawing Sheets

METHOD FOR MANUFACTURING SEMICONDUCTOR DEVICE

BACKGROUND OF THE INVENTION

1. Field of the Disclosure

The disclosure generally relates to a method for manufacturing a semiconductor device. More specifically, the disclosure relates to a method for pattern formation which can overcome the resolution limit of a lithography process in fabricating a semiconductor device.

2. Brief Description of Related Technology

Recently, a double exposure process has been performed to form a fine pattern of semiconductor devices to overcome the resolution limit of exposer equipment. The conventional process is as follows.

Referring to FIGS. 1a and 1b, an underlying layer 12, a first hard mask layer 13, a first anti-reflection film 14 and a first photoresist film 15 are sequentially formed over a semiconductor substrate 11. A first region among the entire surface is exposed using a first exposure mask 16, and the exposed photoresist film 15 is developed to form a first photoresist pattern 15'. The hard mask layer 13 generally is a bi-layer of amorphous carbon layer and inorganic hard mask layer.

Referring to FIGS. 1c and 1d, the first anti-reflection film 14 is etched with the first photoresist pattern 15' as a mask, thereby forming a first anti-reflection pattern 14'. After etching the first hard mask layer 13 with the first anti-reflection pattern 14' as a mask, a first hard mask pattern 13' is formed.

Referring to FIGS. 1e and 1f, a second hard mask layer 17, a second anti-reflection film 18 and a second photoresist film 19 are sequentially formed over the first hard mask pattern 13'. A second region among the entire surface is exposed alternately with the first region using a second exposure mask 20, and the exposed photoresist film 19 is developed to form a second photoresist pattern 19'. The second hard mask layer 17 preferably has different etching selectivity with the first hard mask layer 13.

Referring to FIGS. 1g and 1h, the second anti-reflection film 18 is etched with the second photoresist pattern 19' as a mask, thereby forming a second anti-reflection pattern 18'. After etching the second hard mask layer 17 with the second anti-reflection pattern 18' as a mask, a second hard mask pattern 17' is formed.

Referring to FIG. 1i, an underlying layer 12 is etched with the first and second hard mask patterns 13', 17' as a mask, thereby obtaining a fine pattern 12'.

In the above-described conventional method, however, a photoresist film, an anti-reflection film and a hard mask layer must be coated and etched twice respectively, in order to form a fine pattern. Therefore, the overall process becomes complicated, resulting in the reduction of the total yield.

SUMMARY OF THE DISCLOSURE

Disclosed herein is a method for manufacturing a semiconductor device that includes performing an $O_2$ plasma treatment step over a silicon (Si)-containing anti-reflection film. The disclosed method is advantageous in that the coating and etching steps for preparing a hard mask layer need only be performed once, simplifying and reducing the overall time and costs of conventional processes.

BRIEF DESCRIPTION OF THE DRAWINGS

To understand the present invention more completely, reference should be made to the following detailed description and accompanying drawings wherein.

Figure 1A:
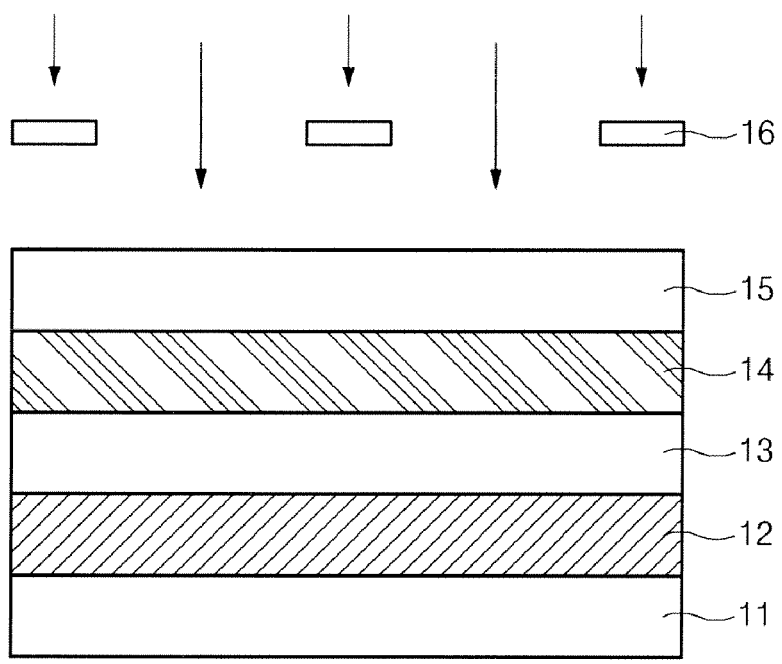
FIGS. 1a through 1i are cross-sectional diagrams illustrating a conventional method for forming a semiconductor device.
Figure 1B:
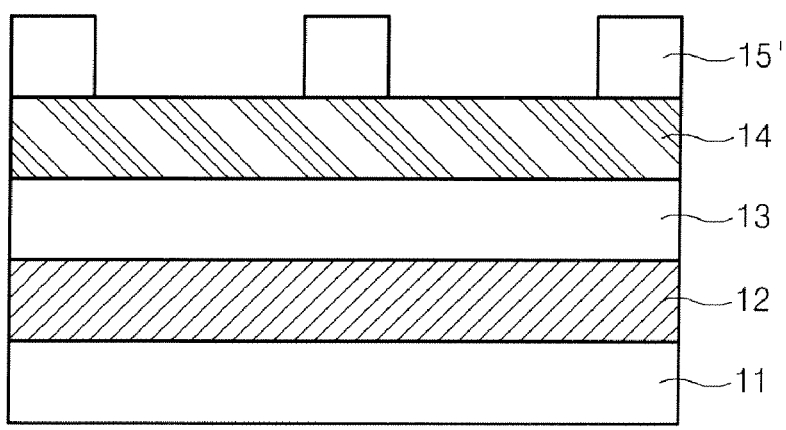
Figure 1C:
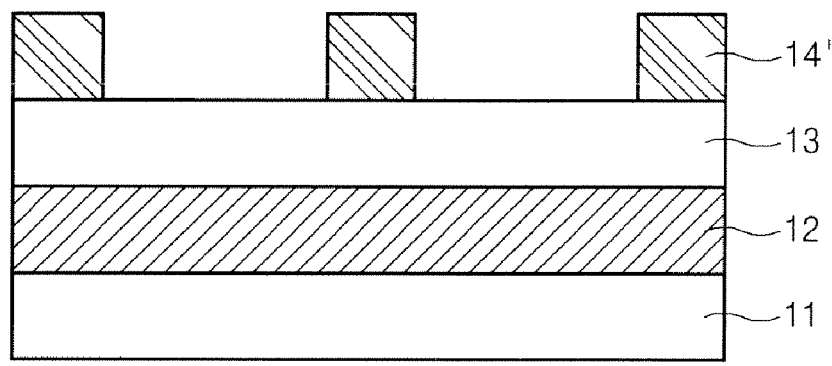
Figure 1D:
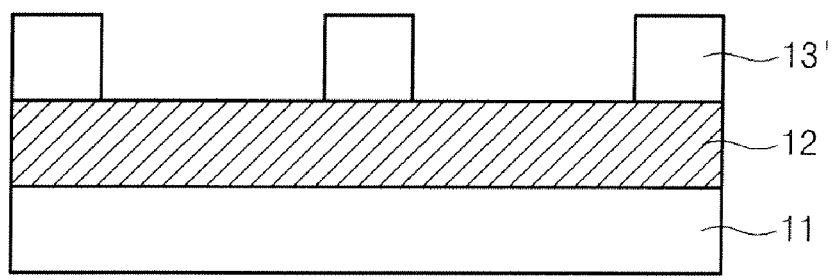
Figure 1E:
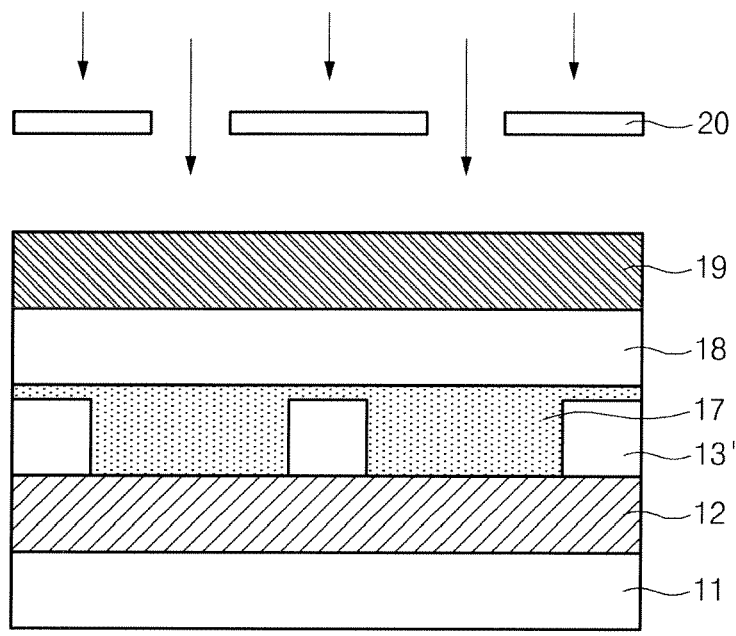
Figure 1F:
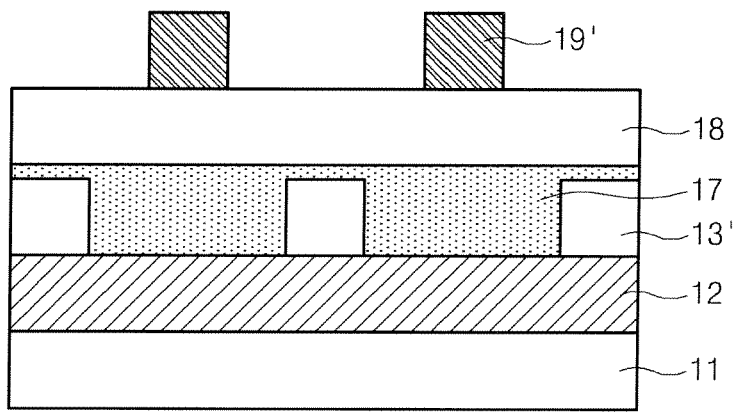
Figure 1G:
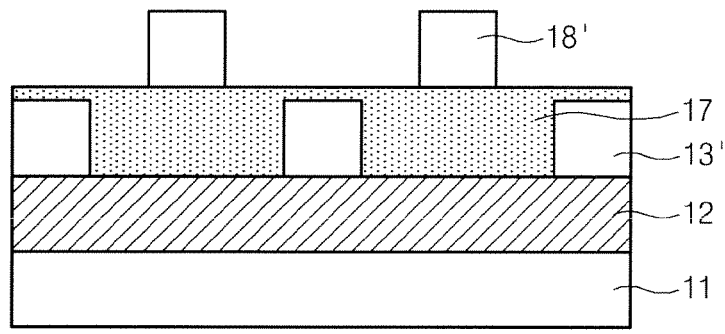
Figure 1H:
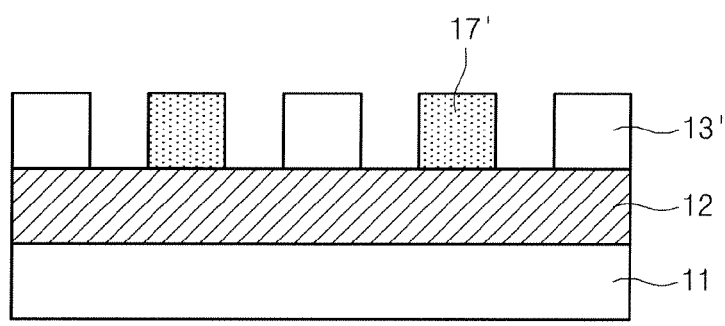
Figure 1I:
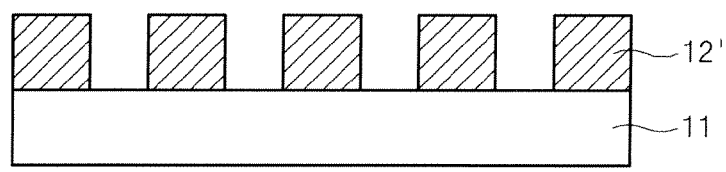

While the disclosed method is susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein.

DETAILED DESCRIPTION OF THE PRESENTLY PREFERRED EMBODIMENTS

Disclosed herein is a method for manufacturing a semiconductor device that includes sequentially forming an underlying layer, a hard mask layer, a Si-containing first anti-reflection film, and a first photoresist film over a semiconductor substrate. The method also includes forming a first photoresist pattern by exposing and developing the first photoresist film using a first exposure mask, and etching the first anti-reflection film with the first photoresist pattern as a mask, thereby forming a first anti-reflection pattern. The method further includes performing $O_2$ plasma treatment over the first anti-reflection pattern, and then sequentially forming a second anti-reflection film and a second photoresist film over the $O_2$ plasma-treated first anti-reflection pattern, and forming a second photoresist pattern by exposing and developing an alternate region, relative to the first anti-reflection pattern, using a second exposure mask. The method also includes etching the second anti-reflection film with the second photoresist pattern as a mask, thereby forming a second anti-reflection pattern, and forming a hard mask pattern by etching the hard mask layer with the first and second anti-reflection patterns as a mask, and etching an underlying layer with the hard mask pattern as a mask, thereby forming an underlying pattern.

According to the disclosed method, the first anti-reflection pattern is formed using a anti-reflection film containing a silicon element. Then, $O_2$ plasma treatment is performed to oxidize the silicon in the first anti-reflection pattern so that the first anti-reflection pattern may not be developed in a subsequent developing step after the second anti-reflection film is formed. The silicon is present in an amount ranging from about 30 wt % to about 40 wt % based on the total weight of the first anti-reflection film.

In the disclosed method, the second anti-reflection film can be formed using the same or different material of the first anti-reflection film. The different material means any anti-reflection composition which does not contain silicon element unlike the first anti-reflection film. The second anti-reflection film may be formed using a conventional anti-reflection composition without restriction.

Meanwhile, for the anti-reflection composition containing a silicon element, any of conventional organic anti-reflection compositions comprising a polymer enabling cross-linking, a light absorbing agent and an organic solvent can be used without restriction. The Si-containing anti-reflection composition can further comprise a cross-linking agent in order to activate the cross-linking reaction upon thermal treatment.

Hereinafter, the disclosed method for manufacturing a semiconductor device is described in detail, with reference to FIGS. 2a through 2i, which are cross-sectional diagrams illustrating the method.

Figure 2A:
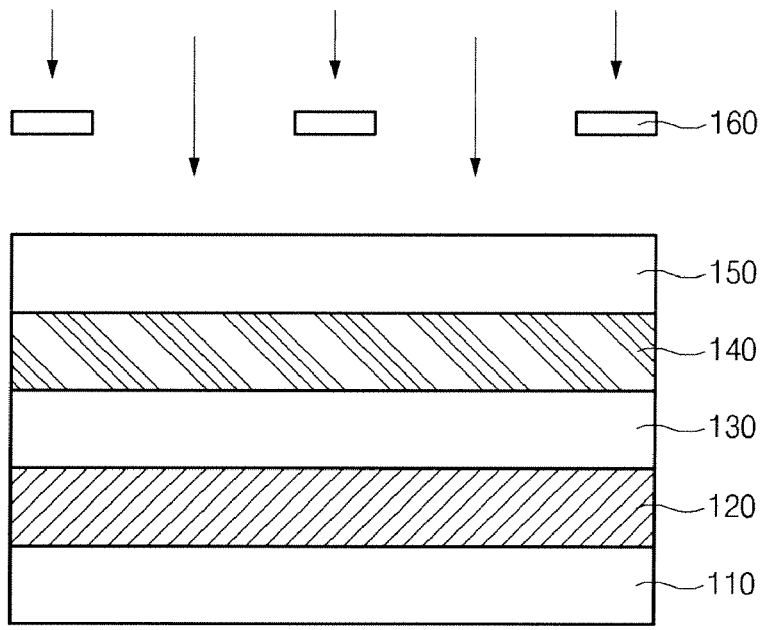
FIGS. 2a through 2i are cross-sectional diagrams illustrating a method of the present invention for forming a semiconductor device.
Figure 2B:
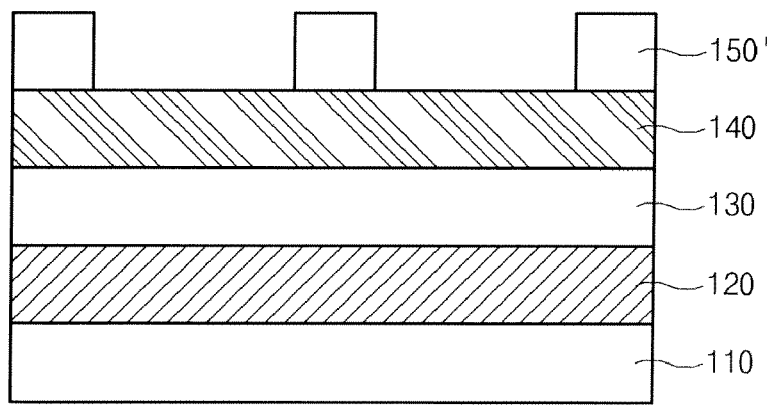

Referring to FIGS. 2a and 2b, an underlying layer 120, a hard mask layer 130, a first anti-reflection film 140, and a first photoresist film 150 are sequentially formed over a semiconductor substrate 110. A first region among the entire surface is exposed using a first exposure mask 160, and exposed photoresist film 150 is developed to form a first photoresist pattern 150'. The first anti-reflection film 140 contains silicon (Si) preferably in an amount ranging from about 30 wt % to about 40 wt %, based on the total weight of the first anti-reflection film. The hard mask layer 130 is generally composed of a bi-layer of amorphous carbon layer and inorganic hard mask layer. In addition, the light source in the exposing steps can be any source capable of providing light having a wavelength below 400 nm. Specifically, the light source is preferably selected from the group consisting of ArF (193 nm), KrF (248 nm), EUV (extreme ultraviolet), VUV (vacuum ultraviolet), E-beam, X-ray, and ion-beam. Among them, ArF, KrF or VUV is more preferable, and ArF is most preferable. The exposing step generally is performed with an exposure energy ranging from about 70 mJ/cm$^2$ to about 150 mJ/cm$^2$, preferably about 100 mJ/cm$^2$ depending on the types of photoresist film.

Figure 2C:
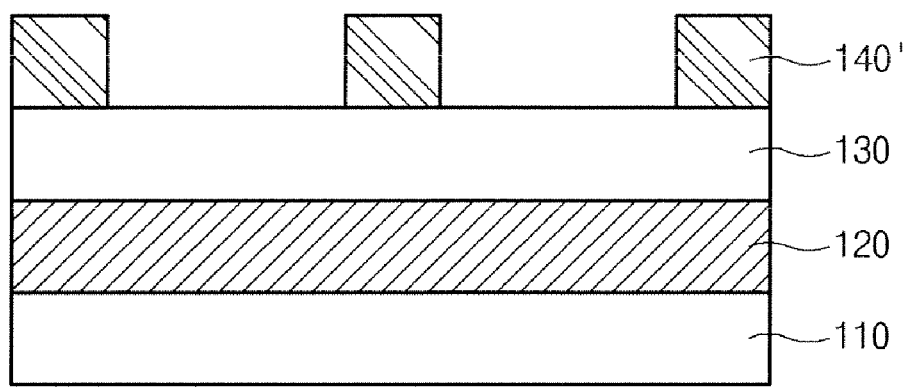
Figure 2D:
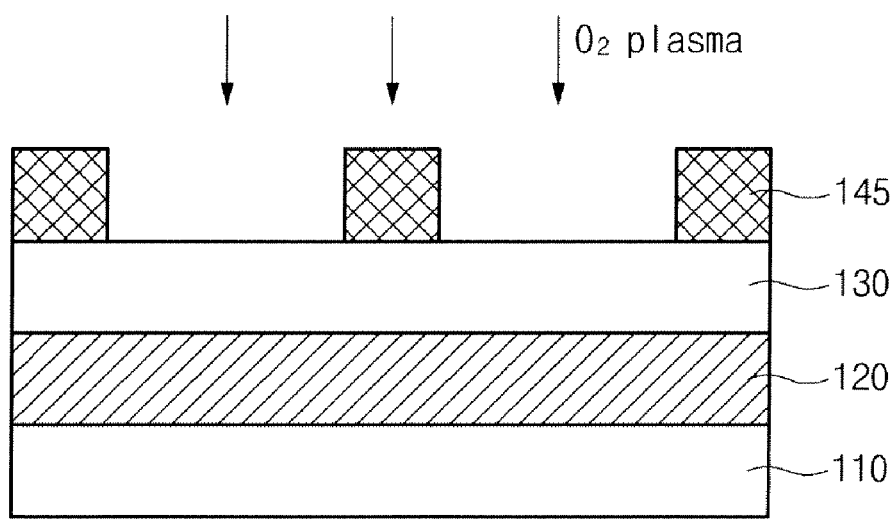

Referring to FIGS. 2c and 2d, the first anti-reflection film 140 is etched with the first photoresist pattern 150' as a mask, thereby forming a first anti-reflection pattern 140'. After that, O$_2$ plasma is treated over the first anti-reflection pattern 140' to oxidize silicon contained therein, thereby forming a SiO$_2$-containing first anti-reflection pattern 145.

Figure 2E:
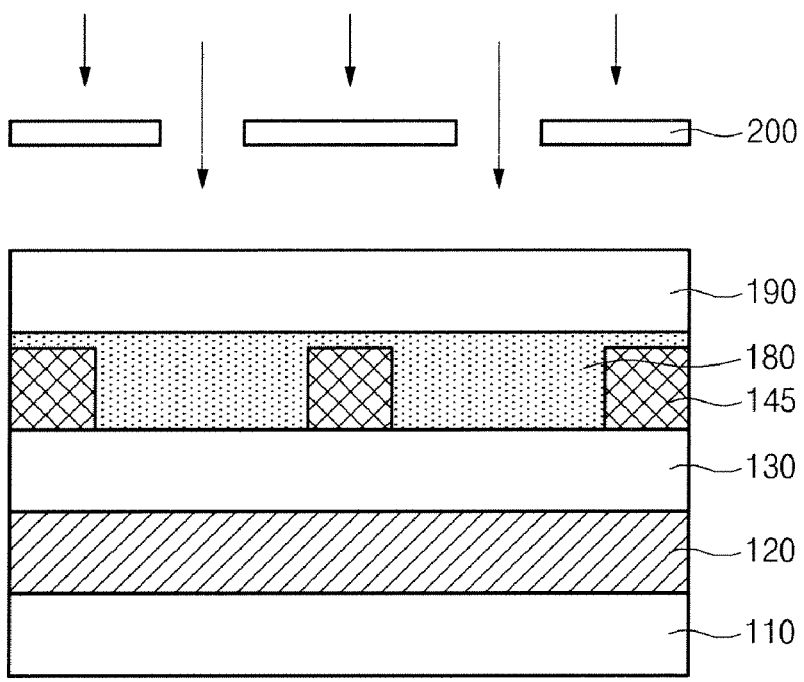
Figure 2F:
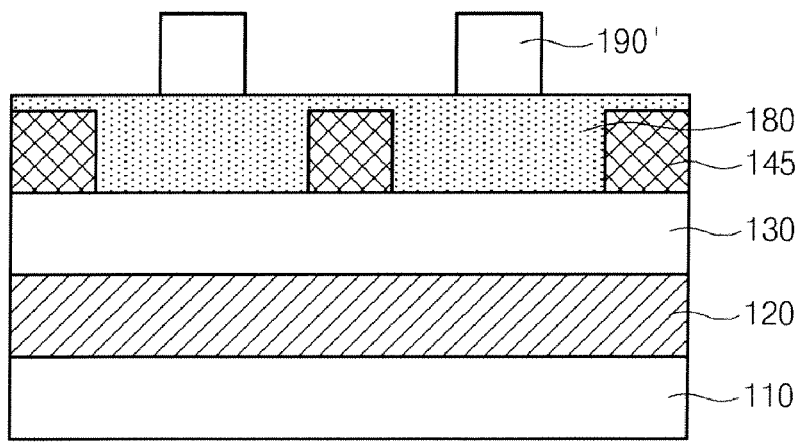

Referring to FIGS. 2e and 2f, a second anti-reflection film 180 and a second photoresist film 190 are formed over the SiO$_2$-containing first anti-reflection pattern 145. A second region among the entire surface is exposed (alternately with the first region) using a second exposure mask 200, and exposed photoresist film 190 is developed to form a second photoresist pattern 190'.

Figure 2G:
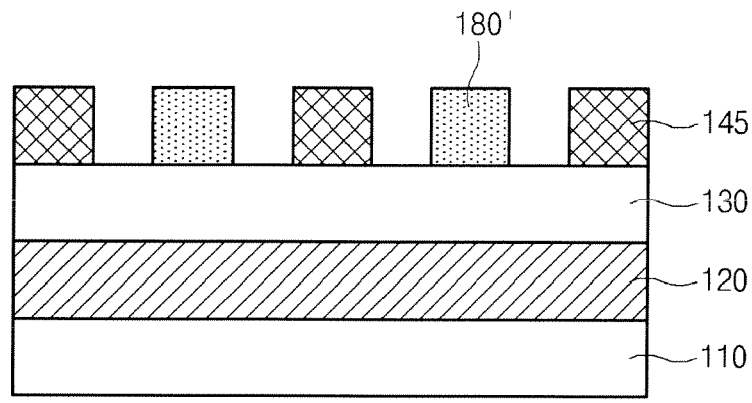
Figure 2H:
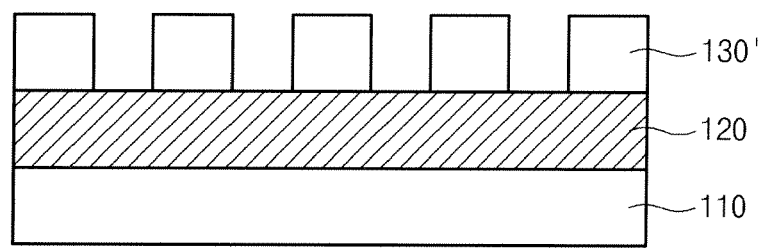

Referring to FIGS. 2g and 2h, the second anti-reflection film 180 is etched with the second photoresist pattern 190' as a mask, thereby forming a second anti-reflection pattern 180'. The first anti-reflection pattern 145 remains despite the etching step due to the oxidation of Si to SiO$_2$ by the O$_2$ plasma treatment. After etching the hard mask layer 130 with the first and second anti-reflection patterns 145, 180' as a mask, a hard mask pattern 130' is formed.

Figure 2I:
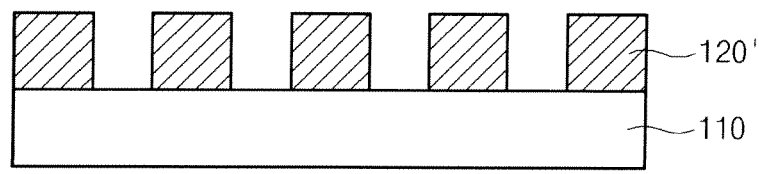

Referring to FIG. 2i, an underlying layer 120 is etched with the hard mask patterns 130' as a mask, and the hard mask patterns are removed, thereby obtaining a fine pattern 120'.

As described above, the disclosed method for manufacturing a semiconductor device includes performing an O$_2$ plasma treatment step after forming a Si-containing anti-reflection film.

What is claimed is:

1. A method for manufacturing a semiconductor device, the method comprising:
   (a) sequentially forming an underlying layer, a hard mask layer, a Si-containing first anti-reflection film, and a first photoresist film over a semiconductor substrate;
   (b) forming a first photoresist pattern by exposing and developing the first photoresist film using a first exposure mask, and etching the first anti-reflection film with the first photoresist pattern as a mask, thereby forming a first anti-reflection pattern;
   (c) performing O$_2$ plasma treatment over the first anti-reflection pattern to form a SiO$_2$-containing first anti-reflection pattern;
   (d) sequentially forming a second anti-reflection film and a second photoresist film over the O$_2$ plasma-treated first anti-reflection pattern, and forming a second photoresist pattern by exposing and developing an alternate region, relative to the first anti-reflection pattern, using a second exposure mask;
   (e) etching the second anti-reflection film with the second photoresist pattern as a mask, thereby forming a second anti-reflection pattern; and
   (f) forming a hard mask pattern by etching the hard mask layer with the first and second anti-reflection patterns as a mask, and etching the underlying layer with the hard mask pattern as a mask, thereby forming an underlying pattern.

2. The method of claim 1, wherein the first anti-reflection film comprises silicon in an amount ranging from 30 wt % to 40 wt %, based on the total weight of the first anti-reflection film.

3. The method according to claim 1, wherein a light source used for the exposing of step (b), step (d), or both steps (b) and (d) is selected from the group consisting of ArF (193 nm), KrF (248 nm), EUV (extreme ultraviolet), VUV (vacuum ultraviolet), E-beam, X-ray, and ion-beam.

4. The method according to claim 3, wherein the light source is ArF (193 nm).

5. The method according to claim 3, wherein the light source used for the exposing of step (b), step (d), or both steps (b) and (d) is selected from the group consisting of ArF (193 nm), KrF (248 nm), and VUV (vacuum ultraviolet).

6. The method according to claim 1, wherein the hard mask layer is a bi-layer of amorphous carbon layer and inorganic hard mask layer.

7. The method according to claim 1, wherein the exposing steps are performed with an exposure energy of about 70 mJ/cm$^2$ to about 150 mJ/cm$^2$.

8. The method according to claim 7, wherein the exposure energy is about 100 mJ/cm$^2$.

9. The method according to claim 1, wherein the second anti-reflection film is formed using the same or different material of the first anti-reflection film.

10. A method for manufacturing a semiconductor device, the method comprising:
    (a) sequentially forming an underlying layer, a Si-containing first anti-reflection film, and a first photoresist film over a semiconductor substrate;
    (b) forming a first photoresist pattern by exposing and developing the first photoresist film using a first exposure mask, and etching the first anti-reflection film with the first photoresist pattern as a mask, thereby forming a first anti-reflection pattern;
    (c) performing O$_2$ plasma treatment over the first anti-reflection pattern to form a SiO$_2$-containing first anti-reflection pattern;
    (d) sequentially forming a second anti-reflection film and a second photoresist film over the O$_2$ plasma-treated first anti-reflection pattern, and forming a second photoresist pattern by exposing and developing an alternate region, relative to the first anti-reflection pattern, using a second exposure mask;
    (e) etching the second anti-reflection film with the second photoresist pattern as a mask, thereby forming a second anti-reflection pattern; and
    (f) forming an underlying pattern by etching the underlying layer with the first and second anti-reflection patterns as a mask.

11. The method of claim 10, wherein the first anti-reflection film comprises silicon in an amount ranging from 30 wt % to 40 wt %, based on the total weight of the first anti-reflection film.

12. The method according to claim 10, wherein a light source used for the exposing of step (b), step (d), or both steps (b) and (d) is selected from the group consisting of ArF (193 nm), KrF (248 nm), EUV (extreme ultraviolet), VUV (vacuum ultraviolet), E-beam, X-ray, and ion-beam.

13. The method according to claim 12, wherein the light source is ArF (193 nm).

14. The method according to claim 12, wherein the light source used for the exposing of step (b), step (d), or both steps (b) and (d) is selected from the group consisting of ArF (193 nm), KrF (248 nm), and VUV (vacuum ultraviolet).

15. The method according to claim 10, wherein the exposing steps are performed with an exposure energy of about 70 $mJ/cm^2$ to about 150 $mJ/cm^2$.

16. The method according to claim 15, wherein the exposure energy is about 100 $mJ/cm^2$.

17. The method according to claim 10, wherein the second anti-reflection film is formed using the same or different material of the first anti-reflection film.

* * * * *